(12) United States Patent
Sover et al.

(10) Patent No.: US 12,235,691 B2
(45) Date of Patent: *Feb. 25, 2025

(54) ELECTRONIC DEVICE INTERCONNECT

(71) Applicant: Intel Corporation, Santa Clara, CA (US)

(72) Inventors: Raanan Sover, Tirat Carmel (IL); Eytan Mann, Modiin (IL); Rafi Ben-Tal, Givat Ada (IL); Richard S Perry, Portland, OR (US)

(73) Assignee: Intel Corporation, Santa Clara, CA (US)

(*) Notice: Subject to any disclaimer, the term of this patent is extended or adjusted under 35 U.S.C. 154(b) by 714 days.

This patent is subject to a terminal disclaimer.

(21) Appl. No.: 17/384,971

(22) Filed: Jul. 26, 2021

(65) Prior Publication Data

US 2022/0083109 A1    Mar. 17, 2022

Related U.S. Application Data

(63) Continuation of application No. 16/829,524, filed on Mar. 25, 2020, now Pat. No. 11,073,873.

(51) Int. Cl.
| | |
|---|---|
| *G06F 1/18* | (2006.01) |
| *H01R 12/72* | (2011.01) |
| *H05K 1/11* | (2006.01) |
| *H05K 7/14* | (2006.01) |
| *H01L 23/538* | (2006.01) |
| *H05K 1/18* | (2006.01) |

(52) U.S. Cl.
CPC .............. *G06F 1/185* (2013.01); *G06F 1/186* (2013.01); *H01R 12/72* (2013.01); *H05K 1/117* (2013.01); *H05K 7/1417* (2013.01); *H01L 23/5386* (2013.01); *H05K 1/181* (2013.01)

(58) Field of Classification Search
CPC ......... G06F 1/185; G06F 1/186; H05K 1/117; H05K 1/181; H05K 7/1417; H01R 12/72; H01L 23/5386
See application file for complete search history.

(56) References Cited

U.S. PATENT DOCUMENTS 6,504,725 B1    1/2003    Lam
10,359,815 B1*  7/2019    Lin ...................... H01R 12/721
(Continued)

OTHER PUBLICATIONS

"U.S. Appl. No. 16/829,524, Notice of Allowance mailed Mar. 25, 2021", 10 pgs.

*Primary Examiner* — Adrian S Wilson
(74) *Attorney, Agent, or Firm* — Akona IP PC

(57) ABSTRACT

An electronic device may include a substrate having a substrate body. The electronic device may include a first interconnect region, for example located proximate to a first end of the substrate. The first interconnect region may extend from the substrate body. The first interconnect region may include a first set of interconnects, and the first set of interconnects may be located proximate to the substrate body. The first interconnect region may include a second set of interconnects, and the second set of interconnects may be located remote from the substrate body. The second set of interconnects may be physically separated from the first set of interconnects, for example by an inactive region. The first set of interconnects may be located between the inactive region and the substrate body.

17 Claims, 11 Drawing Sheets

(56) References Cited

U.S. PATENT DOCUMENTS

| | | | |
|---|---|---|---|
| 10,729,030 B1 | 7/2020 | Cousineau et al. | |
| 11,073,873 B1* | 7/2021 | Sover | G06F 1/186 |
| 2002/0080541 A1* | 6/2002 | Bunker | G06F 1/185 |
| | | | 361/72 |
| 2004/0024940 A1 | 2/2004 | Chiu | |
| 2007/0288677 A1* | 12/2007 | Mambakkam | G06F 11/1435 |
| | | | 710/301 |
| 2008/0101051 A1* | 5/2008 | Middleton | H05K 7/1461 |
| | | | 361/796 |
| 2008/0244113 A1* | 10/2008 | Kealy | G06F 13/385 |
| | | | 710/23 |
| 2015/0163944 A1 | 6/2015 | Goodwin et al. | |
| 2015/0181746 A1* | 6/2015 | Mullen | H05K 7/1487 |
| | | | 361/752 |
| 2016/0181741 A1* | 6/2016 | Kotzur | G06F 1/185 |
| | | | 439/660 |
| 2016/0249455 A1* | 8/2016 | Yang | H05K 1/141 |
| 2016/0255740 A1* | 9/2016 | Ping | G06F 1/16 |
| | | | 710/301 |
| 2017/0168943 A1 | 6/2017 | Chou et al. | |
| 2018/0373664 A1* | 12/2018 | Vijayrao | G06F 9/5044 |
| 2019/0044259 A1* | 2/2019 | Khan | H01R 43/20 |
| 2019/0095774 A1* | 3/2019 | Ping | H05K 1/18 |
| 2020/0065287 A1 | 2/2020 | Grafe et al. | |

* cited by examiner

ELECTRONIC DEVICE INTERCONNECT

PRIORITY

This application is a continuation of U.S. patent application Ser. No. 16/829,524, filed Mar. 25, 2020, which is incorporated by reference herein in its entirety.

TECHNICAL FIELD

This document pertains generally, but not by way of limitation, to memory (e.g., storage) for electronic devices (e.g., a computer, laptop, handheld device, or the like).

BACKGROUND

An electronic device (e.g., a memory device, graphics card, or the like) may include one or more interconnects that facilitate electrical communication of the electronic device with other devices (e.g., a motherboard, or the like) of an electronic system (e.g., a computer, server, mobile device, or the like). In an example, a socket of a motherboard may receive a portion of the electronic device, and the electronic device may electronically communicate with the motherboard through socket.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
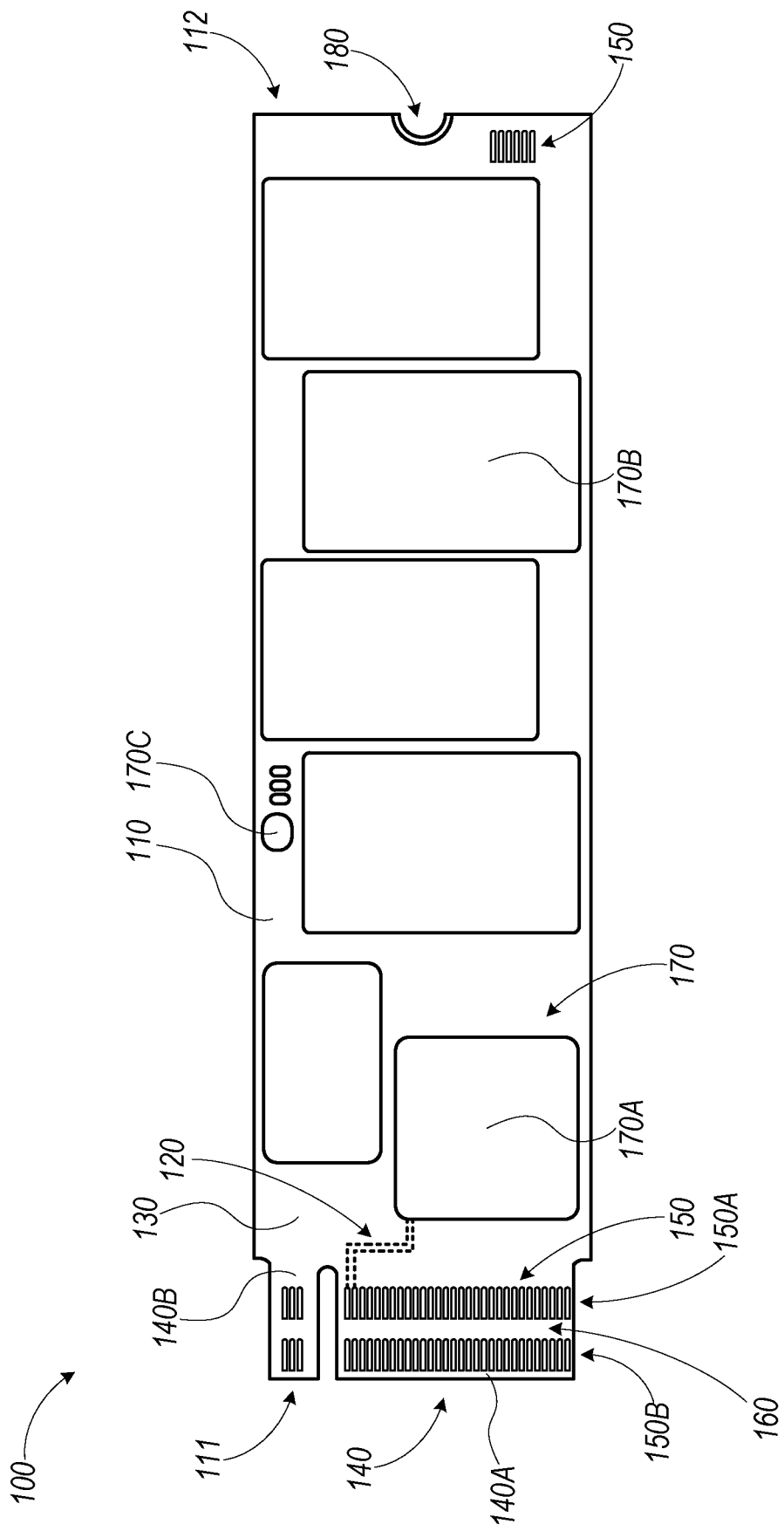
FIG. 1 shows a plan view an example of an electronic device, for example an M.2 memory device.

The present inventors have recognized, among other things, that a problem to be solved may include increasing the functionality of an electronic device, for example an M.2 memory device. For example, the present inventors have recognized, among other things, that a problem to be solved may include increasing an amount of electrical signals transmitted to an electronic device, for example an M.2 memory device. Increasing the amount of electrical signals transmitted to the electronic device may increase the functionality of the electronic device, for instance by providing one or more additional electrical communication pathways (e.g., a channel, connection, conduit, or the like) between the electronic device and a motherboard.

The present subject matter may help provide a solution to this problem, such as by providing an electronic device, for example an M.2 memory device. In an example, one or more aspects of the configurations of the present disclosure can be incorporated into other electronic devices, including (but not limited to) a system on a chip, memory device, daughter card, peripheral card, or the like. The electronic device may include a substrate having a substrate body. The electronic device may include a first interconnect region, for example located proximate to a first end of the substrate. The first interconnect region may extend from the substrate body. The first interconnect region may include a first set of interconnects, and the first set of interconnects may be located proximate to the substrate body. The first interconnect region may include a second set of interconnects, and the second set of interconnects may be located remote from the substrate body. The second set of interconnects may be physically separated from the first set of interconnects, for example by an inactive region. The first set of interconnects may be located between the inactive region and the substrate body.

The electronic device may include a second interconnect region, for instance located at the first end of the substrate. The second interconnect region may extend from the substrate body. The electronic device may include one or more memory die, and the memory die may be coupled to the substrate. One or more electrical traces may be electrical communication with the second set of interconnects. The first set of interconnects and the second set of interconnects may facilitate the electrical communication between a socket and the one or more memory die. In an example, an electrical signal may be transmitted by the socket to an interconnect of the first set of interconnects. The electrical traces may facilitate transmission of the electrical signal from the interconnect to the memory die.

The second set of interconnects located remote from the substrate body increase the functionality of the electronic device. For example, the second set of interconnects may help increase the amount of electrical signals transmitted to the electronic device. For example, the second set of interconnects may provide one or more electrical communication pathways in addition to the electrical communication pathways provided by the first set of interconnects.

The present inventors have recognized, among other things, that a problem to be solved may include interconnecting the electronic device with an electronic system. For example, the electronic device may couple with a socket, and the socket may facilitate the electrical communication of the electronic device with the electronic system. In an example, the socket is included in a motherboard, and the socket facilitates the electrical communication between the electronic device and the motherboard.

The present subject matter may help provide a solution to this problem, such as by inhibiting coupling of an electronic device that is incompatible with the socket. For example, a key profile of the socket may not correspond to a keyway profile of the electronic device if the electronic device is incompatible with the socket. In some approaches, the electronic device does not include the second set of interconnects that are remote from the substrate body. The key may inhibit the first set of interconnects from interfacing with socket interconnects that are intended to interface with the second set of interconnects. For instance, the key may inhibit over-insertion of the electronic device into the socket recess. Accordingly, the key of the socket may ensure a compatible electronic device is coupled with the socket. Ensuring compatibility between the electronic device and the socket may improve performance of the electronic system, for example by reducing electrical faults (including, but not limited to a short circuit or open circuit) or the like.

This overview is intended to provide an overview of subject matter of the present patent application. This overview is not intended to provide an exclusive or exhaustive explanation of the present patent application. The detailed description continues and provides further information about the present patent application.

FIG. 1 shows a plan view an example of an electronic device 100, for example an M.2 memory device. The electronic device 100 may include, but is not limited to, a memory device (e.g., an M.2 memory device, random access memory device, or the like), a daughter card (e.g., a graphics adapter, network adapter, sound adapter, or the like), a peripheral card, or the like. For instance, the electronic device 100 may include a system on a chip, processor, or the like. The electronic device 100 may be included in an electronic system (e.g., a computer, server, mobile device, or the like), and the electronic device 100 may be in electrical communication with one or more other electronic devices (e.g., a motherboard, processor, or the like) of the electronic system.

The electronic device 100 may include a substrate 110. The substrate 110 may include a first end 111 and a second end 112. The substrate 110 may include one or more layers of dielectric material and a conductive material, for example to provide one or more electrical traces 120 within the layers of the substrate 110. The traces 120 may route one or more electrical signals within the substrate 110. The substrate 110 may include a substrate body 130 and one or more interconnect regions 140, for instance a first interconnect region 140A and a second interconnect region 140B.

The interconnect regions 140 may include one or more interconnects 150 that facilitate electrical communication of the electronic device 100 with other electronic devices. In an example, the interconnects 130 may be exposed on a surface of substrate 110, for instance to allow the interconnects 130 to interface with other electronic devices (e.g., an interconnect included in a socket, or the like) of an electronic system. The electronic device 100 may include a first set of interconnects 150A and a second set of interconnects 150B. The first set of interconnects 150A may be physically separated from the second set of interconnects 150B. For example, the sets of interconnects 150A, 150B may be separated by an inactive region 160. The inactive region 160 may be a portion of the interconnect regions 140 that does not contain interconnects 150 (e.g., a portion that does not contain conductive material on the surface of the substrate 110).

In an example, and as shown in FIG. 1, the interconnects 150A may be located proximate to the substrate body 130, and the interconnects 150B may be located remote from the substrate body 130. The interconnects 150B may be located proximate to the first end 111 (e.g., an edge, or the like) of the substrate 110, and the interconnects 150A may be located remote from the first end 111. The inactive region 160 may be located between the interconnects 150B and the substrate body 130. The first set of interconnects 150A may be located between the second set of interconnects 150B and the substrate body 130.

The interconnects 150B may increase the functionality of the electronic device 100, for instance by providing one or more additional electrical communication pathways to the electronic device 100. In some approaches, the electronic device 100 may not include the second set of interconnects 150B and the electronic device 100 is limited to using the first set of interconnects 150A to facilitate electrical communication with other electronic devices of an electronic system. Accordingly, when the electronic device 100 includes the second set of interconnects 150B, the interconnects 150B increase the functionality of the electronic device 100 by providing additional interconnects 150 and corresponding electrical communication pathways to the electronic device 100. The additional interconnects 150 and electrical communication pathways provided by the interconnects 150B may improve the performance of the electronic device 100, for example by increasing an amount of data transferred (or a data transfer rate) between the electronic device 100 and other devices of an electronic system (e.g., a motherboard, or the like).

The electronic device may include one or more electronic components 170, including (but not limited to) one or more of a controller 170A, a memory module 170B (e.g., a semiconductor die, or the like), and one or more passive components 170C (e.g., a resistor, capacitor, or the like). In an example, the electronic components 170 include a system on a chip, or the like. The electronic components 170 may include one or more semiconductor die. The components 170 may be coupled to the substrate 110, and the components 170 may be in electrical communication with the interconnects 150, for example through the traces 120. In some examples, the electronic device 100 includes an M.2 memory device that may store data. For instance, the memory module 170B may include a semiconductor die that stores data (e.g., in a volatile or non-volatile state).

The electronic device 100 may include one or more mounting features 180. The mounting features 180 facilitate coupling of the electronic device 100 with other devices of an electronic system. For examples, the mounting features 180 may receive a fastener (e.g., a screw, bolt, or the like), and the fastener may inhibit relative motion between the electronic component 100 and the other devices of the electronic system.

Figure 2:
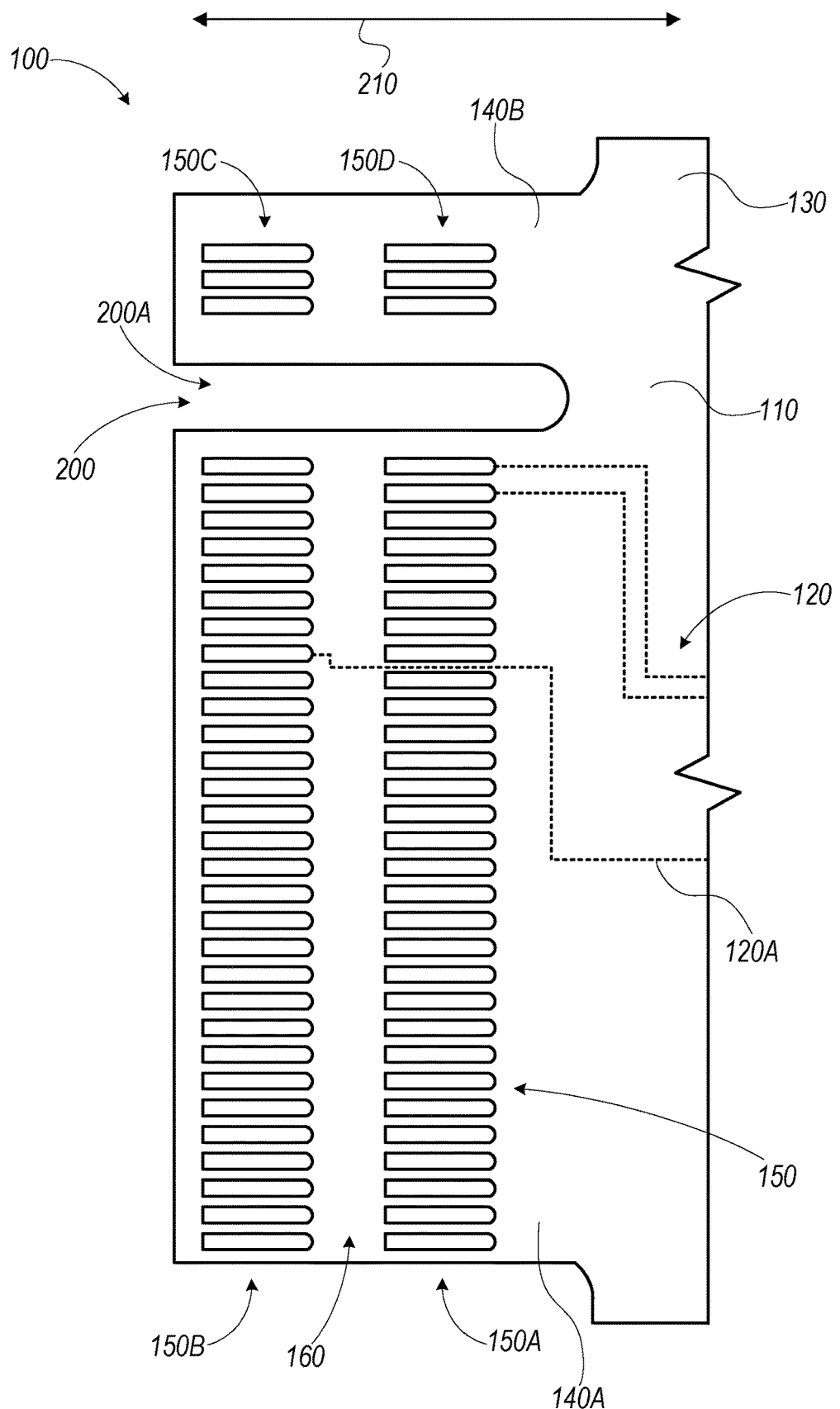
FIG. 2 shows a detailed plan view of the electronic device of FIG. 1.

FIG. 2 shows a detailed plan view of the electronic device 100 of FIG. 1. As described herein, the electronic device 100 may include the interconnect regions 140. The electronic device 100 may include a third set of interconnects 150C and a fourth set of interconnects 150D. The interconnects 150C, 150D may be included in the second interconnect region 140B of the electronic device 100. The interconnects 150C may be located proximate to the substrate body 130, and the interconnects 150D may be located remote from the substrate body 130.

In some examples, one or more keyways 200, for example a keyway 200A (e.g., notch, recess, cutout, or the like) may space apart the interconnect regions 140A, 140B. For example, the keyway 200A may extend along the first set of interconnects 150A and the second set of interconnects 150B. In an example, the keyway 200A may extend along the axis 210. The axis 210 may intersect the first set of interconnects 150A and the second set of interconnects 150B. As described herein, the keyway 200 may facilitate alignment of the electronic device 100 with respect to other devices of an electronic system, for instance a socket of a motherboard.

The electronic device 100 may include the traces 120. The traces 120 may facilitate the electrical communication between the interconnects 150 and the electronic components 170 (e.g., shown in FIG. 1). As shown in FIG. 2, the traces 120 may be coupled with the interconnects 150. For example, the traces 120 may be coupled with (and in electrical communication with) the first set of interconnects 150A. The traces 120 may be coupled with (and in electrical communication with) the second set of interconnects 150B. For instance, a first trace 120A may be coupled with the interconnects 150B. The traces 120 may be located at least partially within a footprint of the first set of interconnects 150A. In an example, the trace 120A may extend from the substrate body 130 and into the interconnect regions 140. The trace 120A may extend through (e.g., route through, pass through, or the like) the footprint of the interconnects 150A. Accordingly, the trace 120A may be located at least partially within the footprint of the interconnects 150C. The traces 120 (e.g., the traces 120A) may extend through the inactive region 160, and the traces 120 may be coupled to the second set of interconnects 150B.

The interconnects 150 may be arranged in various configurations. For example, the interconnects 150A may be included in a first column, and the interconnect 150B may be included in a second column. The inactive region 160 may physically separate the first column from the second column. In another example, the interconnects 150A may be included in a first row, and the interconnects 150B may be included in a second row. The inactive region 160 may physically separate the first row from the second row.

Figure 3:
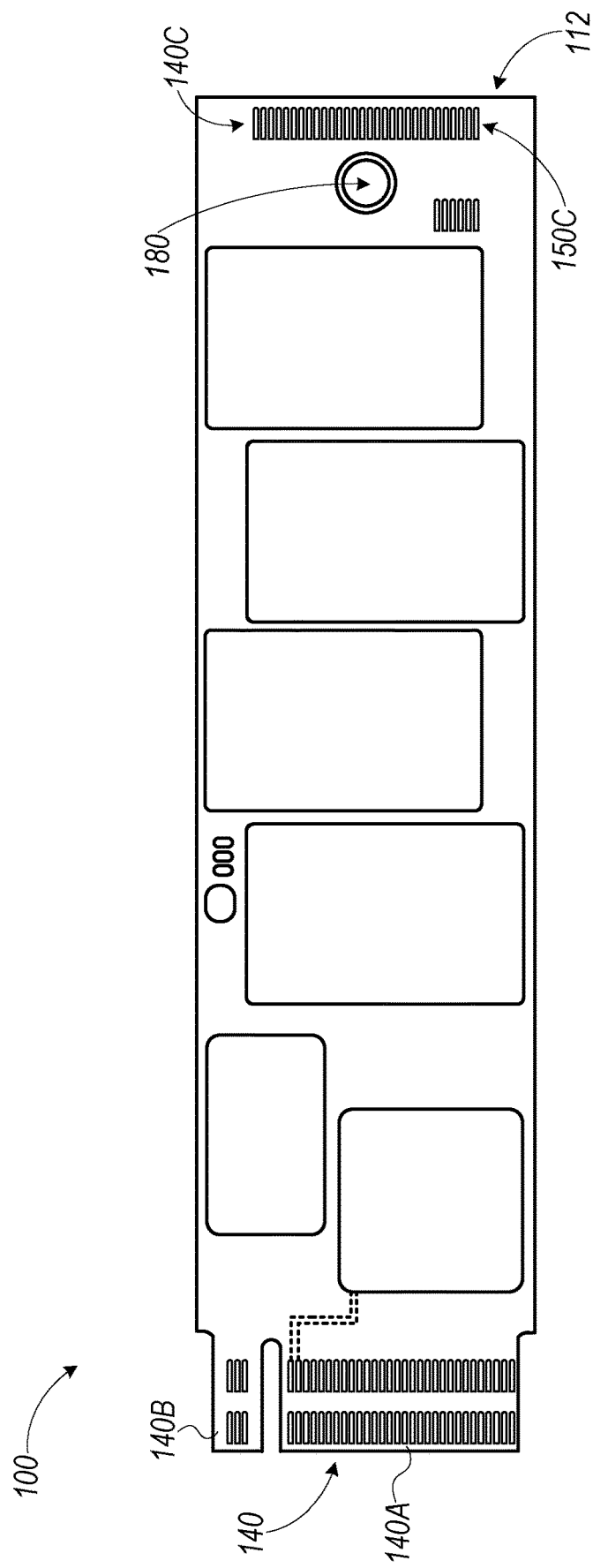
FIG. 3 shows a plan view of another example of the electronic device.
Figure 4:
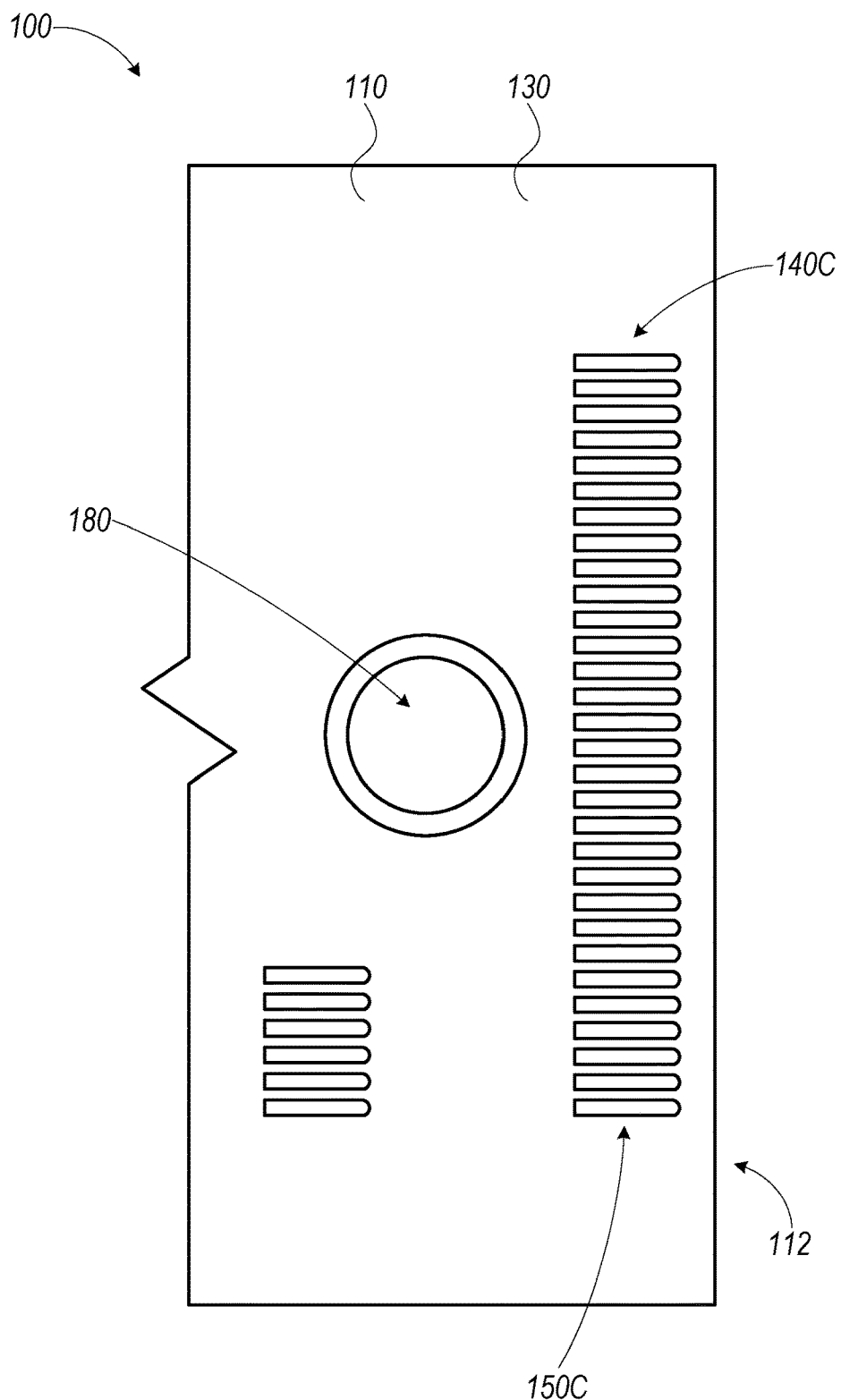
FIG. 4 shows a detailed plan view of the electronic device of FIG. 3.

FIG. 3 and FIG. 4 show a plan view and a detailed plan view (respectively) of another example of the electronic device 100. As described herein, the electronic device may include the interconnect regions 140, for example regions 140A, 140B. The electronic device 100 may include a third interconnect region 140C and a third set of interconnects 150C. The interconnect region 140C and the interconnects 150C may be located proximate to the second end 112 of the substrate 110. The interconnect region 140C and the interconnects 150C may be located between the mounting feature 180 and the second end 112 of the substrate 110. The interconnects 150C may increase the functionality of the electronic device 100, for example by providing additional electrical communication pathways for the electronic device 100.

In some examples, the mounting feature 180 includes a semicircle through hole extending through a thickness of the substrate 110, for example the substrate body 130. In another example, the mounting feature is a circular through hole extending through the thickness of the substrate 110. The mounting feature 180 may facilitate the coupling of the electronic device 100 with other devices of an electronic system (e.g., a socket of a motherboard, or the like).

Figure 5:
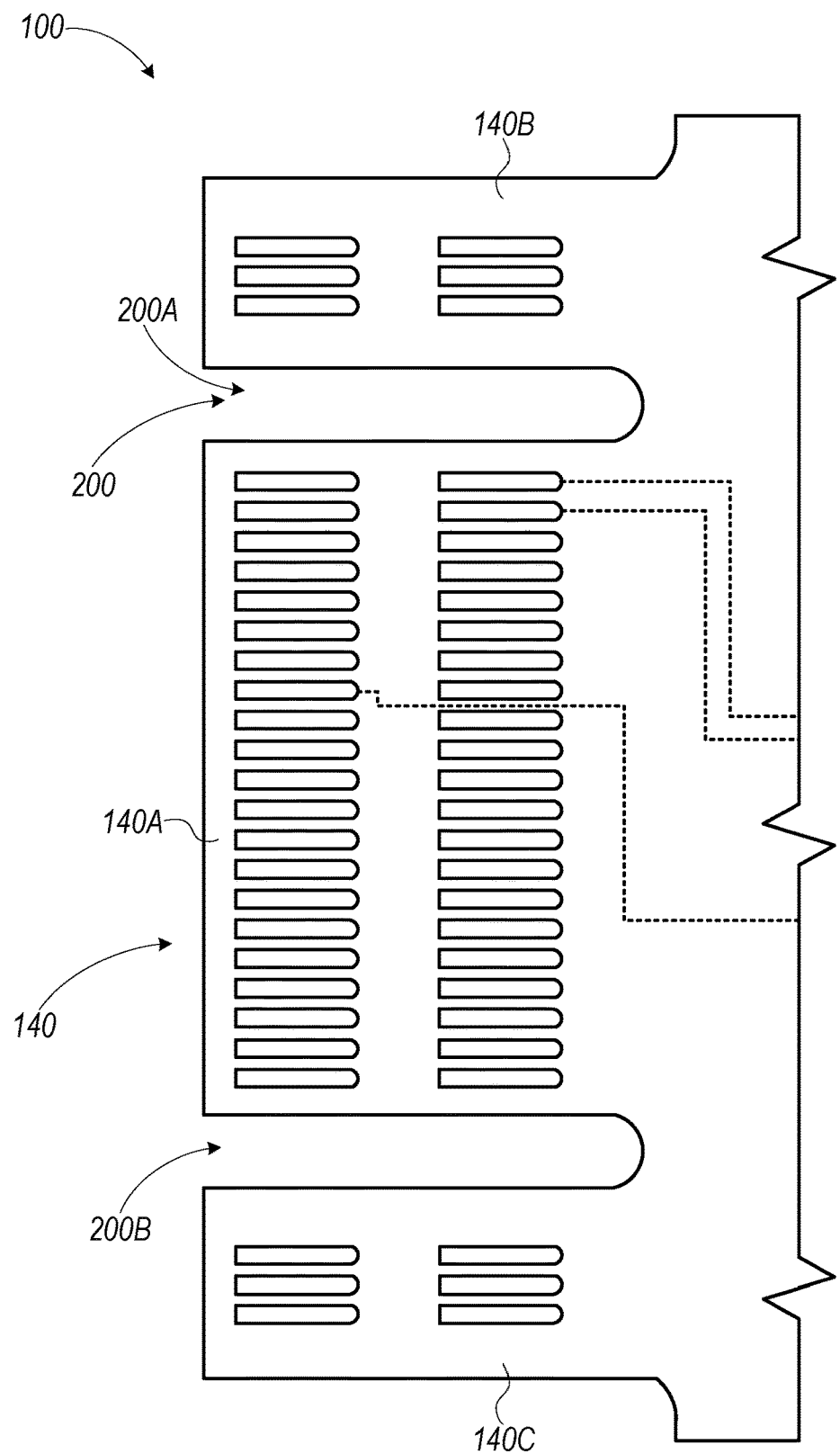
FIG. 5 shows a detailed plan view of yet another example of the electronic device.

FIG. 5 shows a detailed plan view of yet another example of the electronic device 100. As described herein, the electronic device 100 may include the one or more keyways 200. For example, the electronic device 100 may include the first keyway 200A and a second keyway 200B. The keyways 200 may facilitate coupling the electronic device 100 with an electronic device (e.g., a socket compatible with the electronic device 100 including the first keyway 200A and the second keyway 200B).

The keyways 200 may be located between the interconnect regions 140 of the electronic device 100. For example, the keyway 200A may be located between the first interconnect region 140A and the second interconnect region 140B. The second keyway 200B may be located between the first interconnect region 140A and a fourth interconnect region 140B. As described herein, the keyways 200 may inhibit coupling the electronic device with other devices (e.g., a socket) that is incompatible with the electronic device 100.

Figure 6:
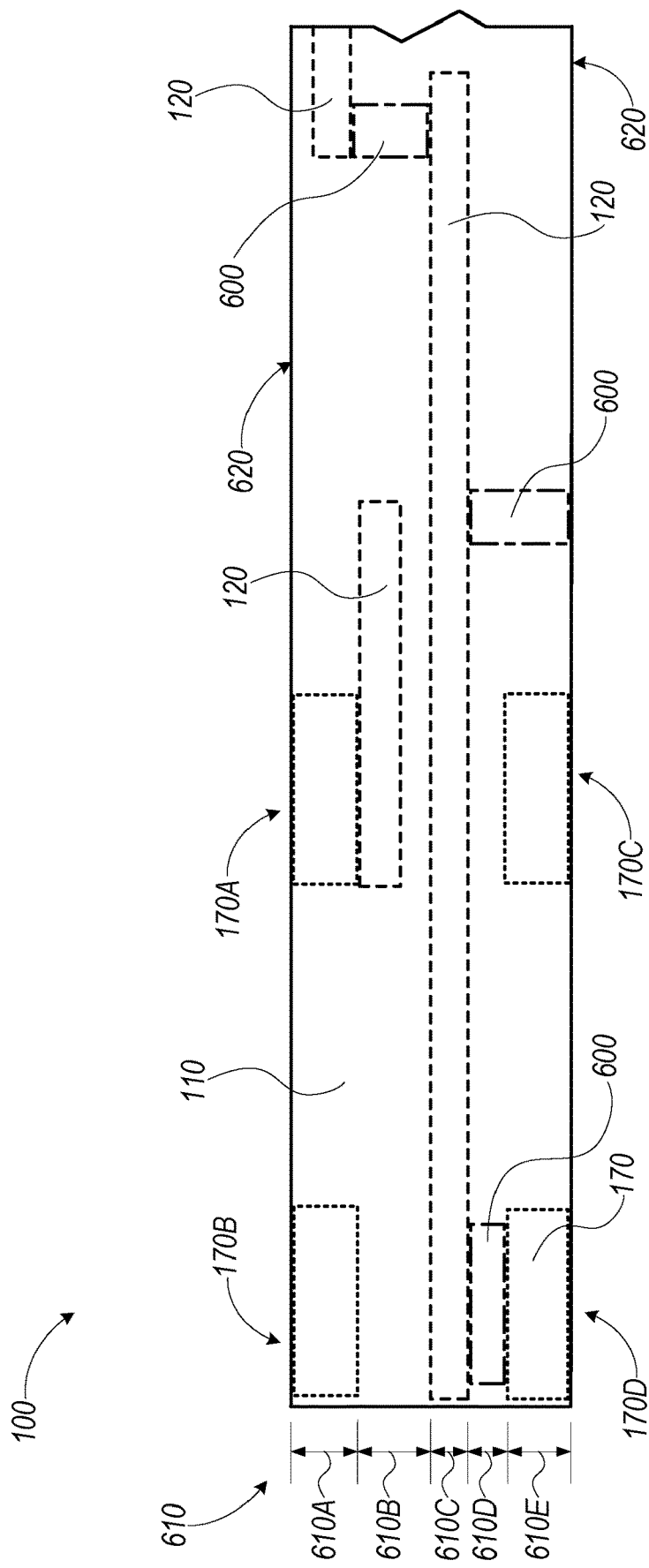
FIG. 6 shows a schematic view of still yet another example of the electronic device.

FIG. 6 shows a schematic view of still yet another example of the electronic device 100. The substrate 110 may include a via 600 (e.g., a vertical interconnect access, or the like). The via 600 may facilitate electrical communication between one or more layers 610 of the substrate 110. For example, the wiring traces 120 may route electrical signals within the substrate 110. The via 600 may be coupled between the traces 120 located in different layers 610 of the substrate 110. For example, the substrate 110 may include traces 120 in a first layer 610A, a second layer 610B, and a third layer 610C of the substrate 110. In an example, the via 600 may be coupled to the traces 120 in the first layer 610A and the traces 120 in the third layer 610C. Accordingly, the via 600 facilitates electrical communication between the layers 610A, 610C, for example by routing electrical signals through the layers 610 of the substrate 110. For instance, the via 600 may include a through hole via. The via 600 may extend to a surface 620 (e.g., a face, side, or the like) of the substrate 110 (e.g., a bottom surface of the substrate 110).

The via 600 may facilitate locating the wiring traces 120 within a footprint of the first set of electrical interconnects 170A. For example, the via 600 may facilitate routing of the wiring traces 120 around the first set of electrical interconnects 170A (and associated traces 120) in the layer 610A, 610B. The via 600 may facilitate routing electrical signals in a fourth layer 610D and a fifth layer 610E. For instance, the interconnects 170C, 170D may be located in the fifth layer 110E, and the via 600 may be coupled to the wiring trace 130 in the layer 610C and an individual one of the interconnects 170 in the fifth layer 610E. Accordingly, the via 600 facilitates electrical communication within the substrate 110. In an example, the via 600 may facilitate routing of an electrical signal associated with the second set of interconnects 170B through the footprint of the first set of interconnects 170A.

The interconnects 170 may facilitate the electrical communication of the electronic device 100 with other devices of an electronic system. For example, the interconnects 170 may be exposed on the surface 620 of the substrate 110 (e.g., on a top surface and a bottom surface of the substrate 110). The interconnects 170 may extend from, or may be recessed below, the surface 620 of the substrate 110. The interconnects 170 may interface with the other devices to establish one or more electrical communication pathways between the electronic device 100 and the other devices of an electronic system (e.g., a socket included in a motherboard, or the like).

Figure 7:
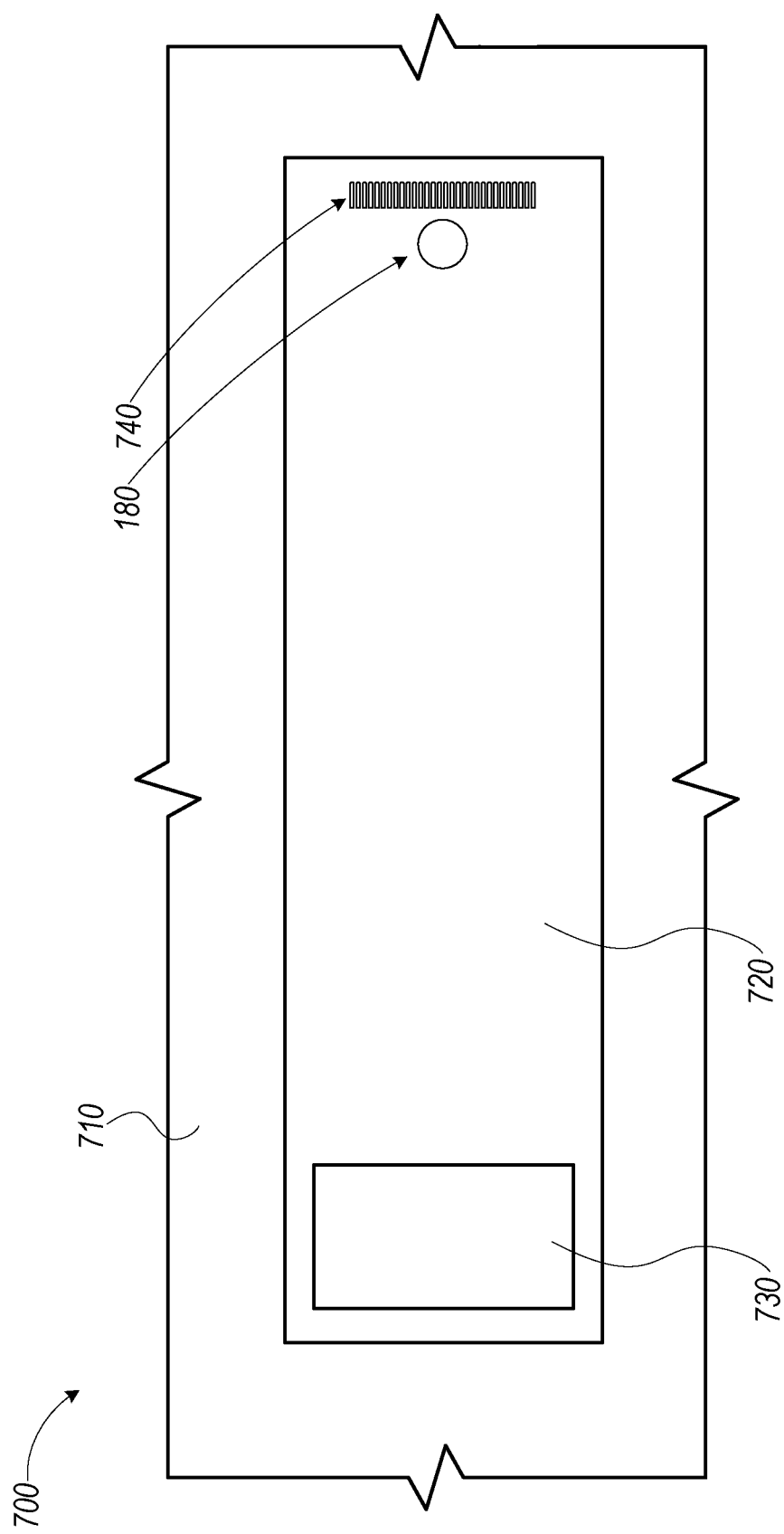
FIG. 7 shows a schematic view of an electronic system.

FIG. 7 shows a schematic view of an electronic system 700. The electronic system 700 may include a motherboard 710, and the system 700 may include a socket 720. The electronic device 100 may couple with the socket 720, for example to establish one or more electrical communication pathways between the motherboard 710 and the electronic device 100 (e.g., shown in FIG. 1). Accordingly, the socket 720 may facilitate the electrical communication between the electronic device 100 and the motherboard 710.

The socket 720 may include a socket body 730, and the socket body 730 may receive a portion of the electronic device (e.g., the first end 111, shown in FIG. 1). The socket 720 may include socket interconnects 740 (e.g., a pin, button, clip, or the like), and the socket interconnects 740 may interface with the interconnects 170 of the electronic device 100 to establish one or more electrical communication pathways between the electronic device 100 and other devices of the electronic system 700, for instance the motherboard 710.

The socket 720 may include the mounting features 180. For example, the socket 720 may include a stud configured to engage with a fastener to secure the electronic device 100 to the socket 720. In another example, a stud from a motherboard extends through the socket 180.

Figure 8:
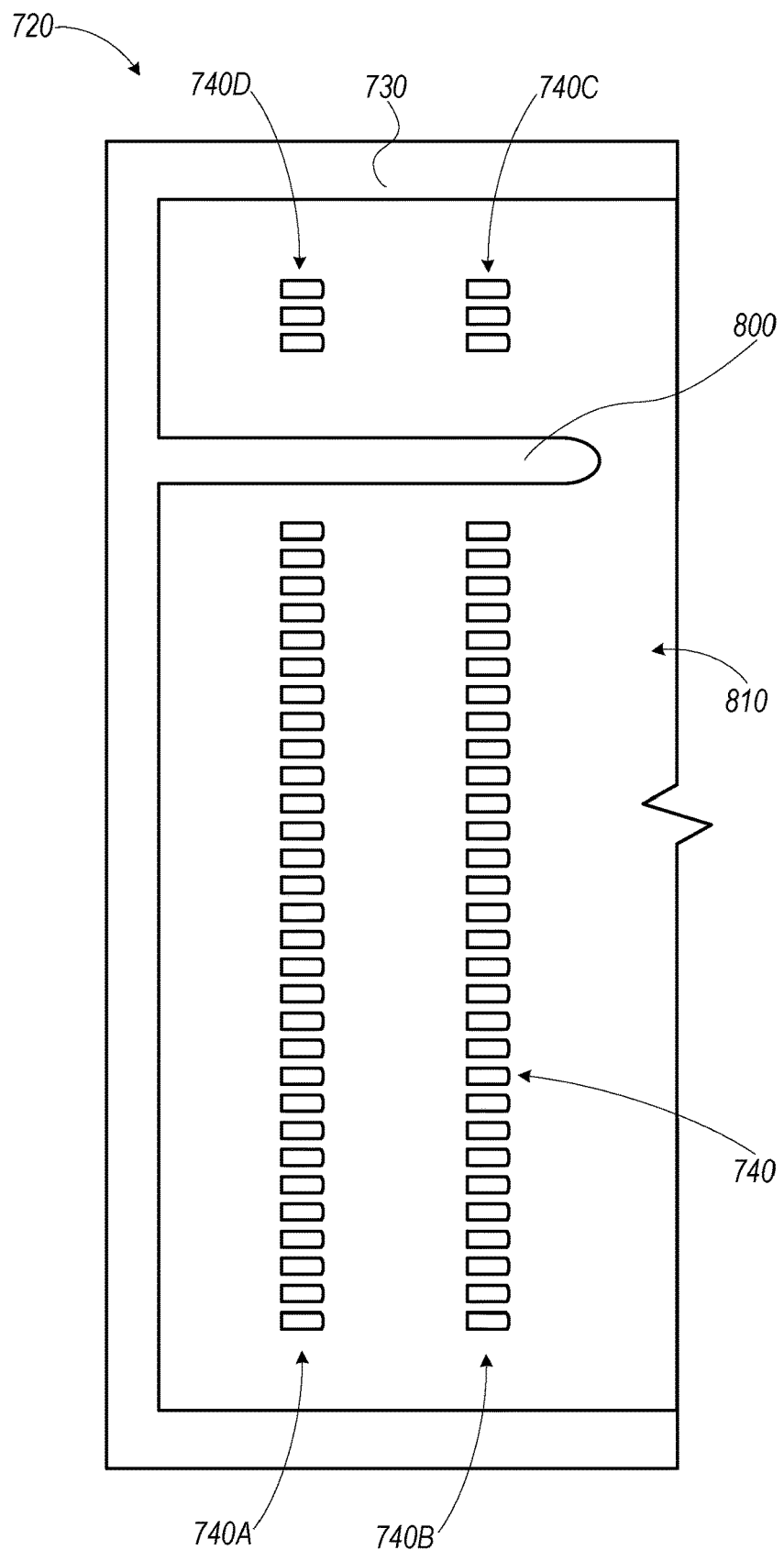
FIG. 8 shows a schematic view of a socket body.

FIG. 8 shows a schematic view of the socket 720. The socket body 730 may include the socket interconnects 740. For example, the socket body 730 may include (but is not limited to) a first set of socket interconnects 740A, a second set of socket interconnects 740B, a third set of socket interconnects 740C, and a fourth set of socket interconnects 740B. The socket interconnects 740 may interface with the interconnects 170 (e.g., shown in FIG. 1) of the electronic device 100 to establish electrical communication pathways between the socket 720 and the electronic device 100.

The socket 720 may include a key 800 (e.g., a notch, pin, protrusion, or the like). The key 800 may extend into a socket recess 810 of the socket body 730. The key 800 may engage with a keyway of the electronic device 100, for example the keyway 200A (e.g., shown in FIG. 2). The key may facilitate alignment of the electronic device 100 with respect to the socket 720. For instance, the socket body 730 may define a socket recess 810, and the socket recess 810 may receive a portion of the electronic device 100 (e.g., shown in FIG. 1). For example, the socket recess 810 may receive the first end 111 of the substrate 110, including the interconnect regions 140A, 140B (e.g., shown in FIG. 1). The key 800 may facilitate alignment of the device 100 with the recess 810.

In an example, the key 800 may engage with electronic device 100 when the electronic device is correctly aligned (e.g., oriented, arranged, located, positioned, or the like) with respect to the socket 720. For instance, the keyway 200A (e.g., shown in FIG. 2) may receive the key 800 when the electronic device 100 is correctly aligned with the socket 720, for instance aligned with the recess 810. Optionally, the key 800 may include a key profile (e.g., one or more of cross-section, shape, size, dimensions, contour, radius, perimeter, circumference, outline, boundary, configuration, pattern, arrangement, thickness or the like). The keyway 200A may include a keyway profile, and the keyway profile may correspond to (e.g., match, mirror, mimic, be compatible with, or the like) the key profile, for instance to allow the keyway 200A to receive the key 800.

The key 800 may engage with the electronic device 100, for example when the electronic device 100 is misaligned with the recess 810. For instance, the key 800 may inhibit the coupling of the electronic device 100 with the socket 720 when the electronic device 100 is misaligned with the socket 100. In an example, the key 800 may engage with the first end 111 of the electronic device 100 to inhibit the socket recess 810 from receiving the first end 111. The key 800 may inhibit the socket interconnects 740 (e.g., interconnects 740A) of the socket 720 from interfacing with device interconnects (e.g., the first set of interconnects 150A, or the like) when the electronic device 100 is misaligned with the socket 720. In another example, the socket 720 may inhibit coupling of an electronic device 100 that is incompatible with the socket 720.

For example, the key profile of the socket 720 may not correspond to the keyway profile of the electronic device 100 if the electronic device 100 is incompatible with the socket 720 (e.g., the device 100 is intended for use in a different electronic system, or the like). In some approaches, the electronic device 100 does not include the second set of interconnects 150B that are located remote from the substrate body 130. The key 800 may inhibit the first set of interconnects 150A from interfacing with socket interconnects that are intended to interface with the second set of interconnects 150B. For example, the socket interconnects 740A may interface with the interconnects 150A of the device 100 when the device 100 is coupled with the socket 720. The socket interconnects 740B may interface with the interconnects 150B of the device 100 when the device 100 is coupled with the socket 720. The key 800 may inhibit the interconnects 150B (shown in FIG. 1) from interfacing with the interconnects 740A. For instance, then key 800 (and the keyway 200) may inhibit over-insertion of the electronic device 100 into the socket 720. Accordingly, the key 800 facilitates coupling of the electronic device 100 with the socket 720 (e.g., by ensuring a compatible device is coupled with the socket).

Figure 9:
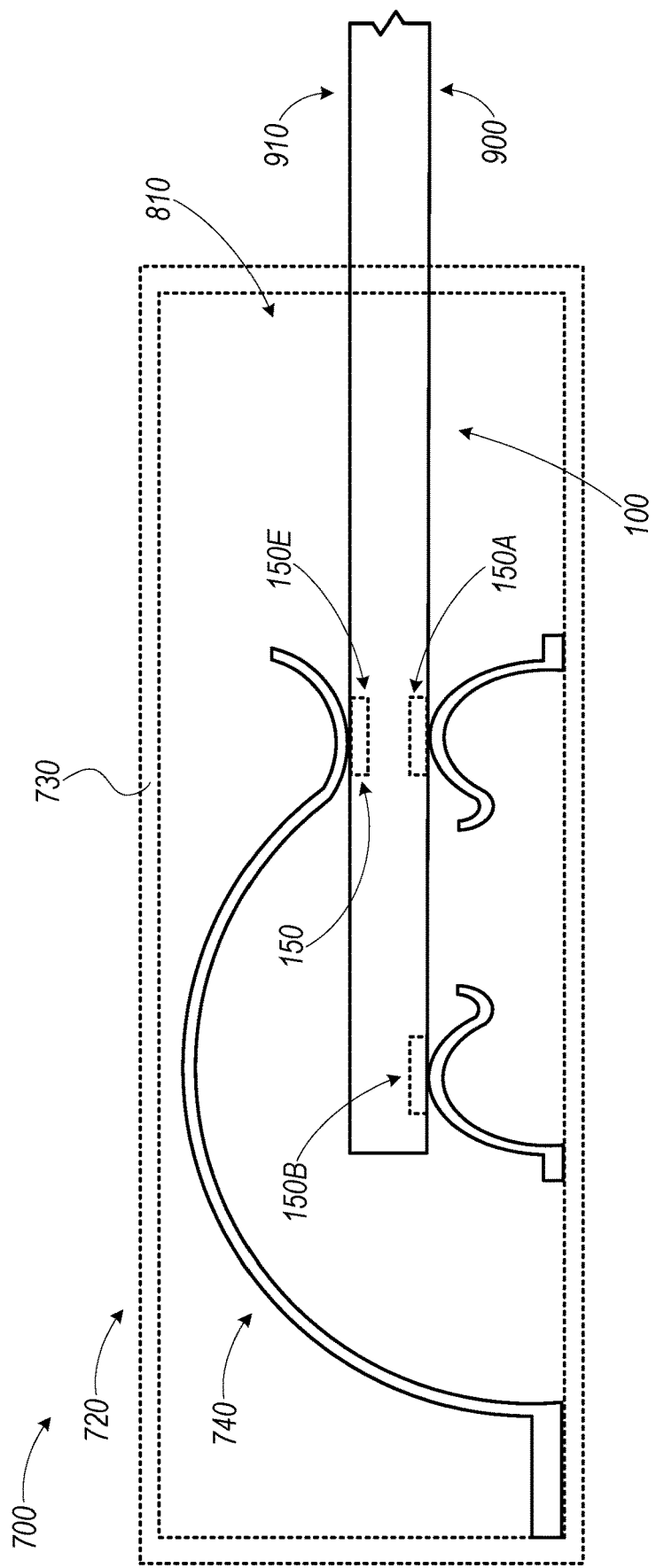
FIG. 9 shows a schematic view of another example of the electronic system.

FIG. 9 shows a schematic view of another example of the electronic system 700. The electronic system 700 may include the electronic device 100 and the socket 720. The electronic device 100 may couple with the socket 720, for example when the device 100 is received in the recess 810 of the socket body 730. The socket interconnects 740 may interface with the interconnects 150 of the electronic device 100, for instance when the device 100 is coupled with the socket 720.

In an example, the device 100 may include the one or more interconnects 150 (e.g., the sets of interconnects 150A, 150B). The substrate 110 may include a first side 900 and a second side 910. The electronic device 100 may include interconnects 150 (e.g., a pad, or the like) on the first side 900 and may include interconnects 150 on the second side 910. For instance, the interconnects 150A, 150B may be included on the first side 900 of the device 100, and a fifth set of interconnects 150E may be included on the second side 910. The socket interconnects 740 may interface with the interconnects 150 on the sides 900, 910 of the electronic device 100.

Figure 10:
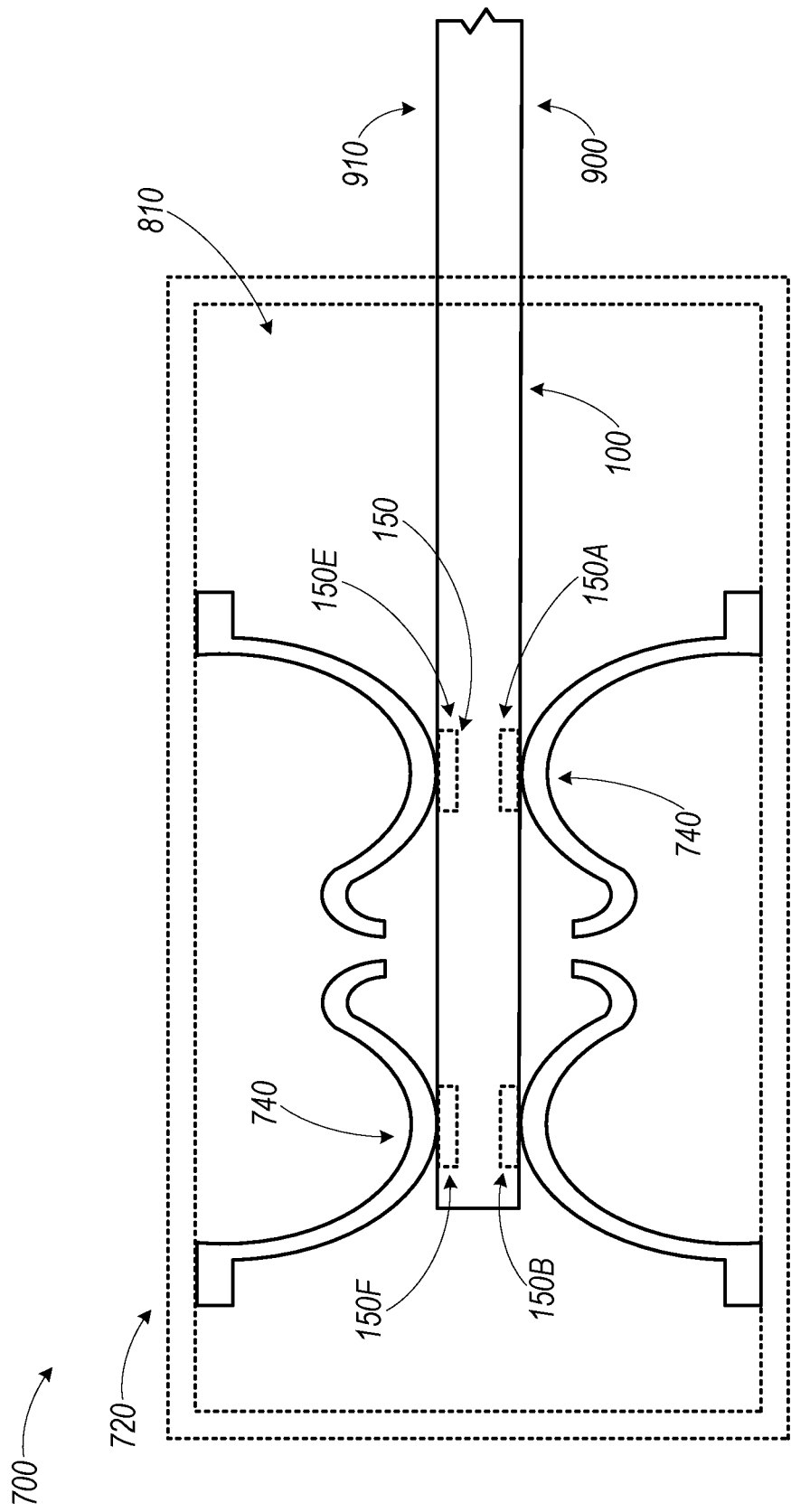
FIG. 10 shows a schematic view of yet another example of the electronic system.

FIG. 10 shows a schematic view of yet another example of the electronic system 700. As described herein, the electronic device 100 may include interconnects 150 on the sides 900, 910 of the device 100. For example, the electronic device 100 may include the first and second sets of interconnects 150A, 150B on the first side 900, and may include the fifth set of interconnects 150E and a sixth set of interconnects 150F on the second side 910.

The interconnects 150A, 150E may be proximate to the substrate body 130 (e.g., shown in FIG. 2). The interconnects 150B, 150F may be located remote from the substrate body 130 (e.g., shown in FIG. 2). The interconnects 150A may be aligned with the interconnects 150E. The interconnects 150B may be aligned with the interconnects 150F. The socket interconnects 740 may interface with the interconnects 150 on the sides 900, 910 of the electronic device 100.

Figure 11:
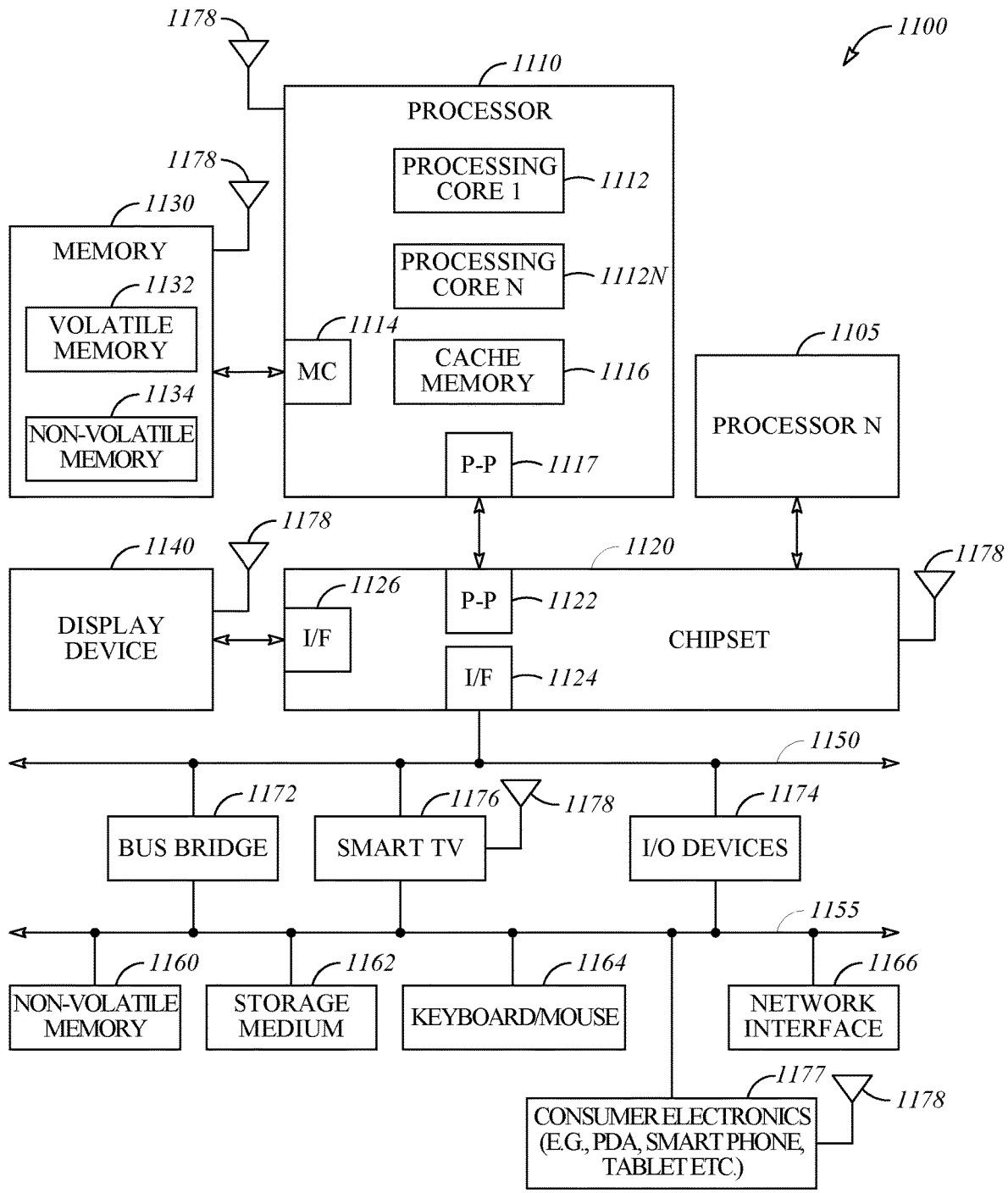
FIG. 11 illustrates a system level diagram, depicting an example of an electronic device.

FIG. 11 illustrates a system level diagram, depicting an example of an electronic device (e.g., system) including (but not limited to) one or more of the electronic device 100, the interconnects 150, the system 700, or the socket 720 as described in the present disclosure. FIG. 11 is included to show an example of a higher level device application for one or more of the electronic device 100, the interconnects 150, the system 700, or the socket 720. In one embodiment, system 1100 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1100 is a system on a chip (SOC) system.

In one embodiment, processor 1110 has one or more processor cores 1112 and 1112N, where 1112N represents the Nth processor core inside processor 1110 where N is a positive integer. In one embodiment, system 1100 includes multiple processors including 1110 and 1105, where processor 1105 has logic similar or identical to the logic of processor 1110. In some embodiments, processing core 1112 includes, but is not limited to, pre-fetch logic to fetch instructions, decode logic to decode the instructions, execution logic to execute instructions and the like. In some embodiments, processor 1110 has a cache memory 1116 to cache instructions and/or data for system 1100. Cache memory 1116 may be organized into a hierarchal structure including one or more levels of cache memory.

In some embodiments, processor 1110 includes a memory controller 1114, which is operable to perform functions that enable the processor 1110 to access and communicate with memory 1130 that includes a volatile memory 1132 and/or a non-volatile memory 1134. In some embodiments, processor 1110 is coupled with memory 1130 and chipset 1120. Processor 1110 may also be coupled to a wireless antenna 1178 to communicate with any device configured to transmit and/or receive wireless signals. In one embodiment, an interface for wireless antenna 1178 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1134 includes, but is not limited to, flash memory, phase change memory (PCM), read-only memory (ROM), electrically erasable programmable read-only memory (EEPROM), or any other type of non-volatile memory device.

Memory 1130 stores information and instructions to be executed by processor 1110. In one embodiment, memory 1130 may also store temporary variables or other intermediate information while processor 1110 is executing instructions. In the illustrated embodiment, chipset 1120 connects with processor 1110 via Point-to-Point (PtP or P-P) interfaces 1117 and 1122. Chipset 1120 enables processor 1110 to connect to other elements in system 1100. In some embodiments of the example system, interfaces 1117 and 1122 operate in accordance with a PtP communication protocol such as the Intel® QuickPath Interconnect (QPI) or the like. In other embodiments, a different interconnect may be used.

In some embodiments, chipset 1120 is operable to communicate with processor 1110, 1105N, display device 1140, and other devices, including a bus bridge 1172, a smart TV 1176, I/O devices 1174, nonvolatile memory 1160, a storage medium (such as one or more mass storage devices) 1162, a keyboard/mouse 1164, a network interface 1166, and various forms of consumer electronics 1177 (such as a PDA, smart phone, tablet etc.), etc. In one embodiment, chipset 1120 couples with these devices through an interface 1124. Chipset 1120 may also be coupled to a wireless antenna 1178 to communicate with any device configured to transmit and/or receive wireless signals.

Chipset 1120 connects to display device 1140 via interface 1126. Display 1140 may be, for example, a liquid crystal display (LCD), a plasma display, cathode ray tube (CRT) display, or any other form of visual display device. In some embodiments of the example system, processor 1110 and chipset 1120 are merged into a single SOC. In addition, chipset 1120 connects to one or more buses 1150 and 1155 that interconnect various system elements, such as I/O devices 1174, nonvolatile memory 1160, storage medium 1162, a keyboard/mouse 1164, and network interface 1166. Buses 1150 and 1155 may be interconnected together via a bus bridge 1172.

In one embodiment, mass storage device 1162 includes, but is not limited to, a solid state drive, a hard disk drive, a universal serial bus flash memory drive, or any other form of computer data storage medium. In one embodiment, network interface 1166 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 11 are depicted as separate blocks within the system 1100, the functions performed by some of these blocks may be integrated within a single semiconductor circuit or may be implemented using two or more separate integrated circuits. For example, although cache memory 1116 is depicted as a separate block within processor 1110, cache memory 1116 (or selected aspects of 1116) can be incorporated into processor core 1112.

Various Notes & Aspects

Aspect 1 is an M.2 memory device, comprising: a substrate having a substrate body and a first interconnect region located proximate to a first end of the substrate and extending from the substrate body, the first interconnect region including: a first set of interconnects located proximate to the substrate body; a second set of interconnects located remote from the substrate body and physically separated from the first set of interconnects by an inactive region, wherein the first set of interconnects are located between the inactive region and the substrate body; and a second interconnect region located at the first end of the substrate and extending from the substrate body; one or more memory die coupled to the substrate; and one or more electrical traces in electrical communication with the second set of interconnects; and wherein the first set of interconnects and the second set of interconnects are configured to facilitate the electrical communication between a socket and the one or more memory die.

In Aspect 2, the subject matter of Aspect 2 optionally includes wherein the electrical traces in communication with the second set of interconnects are located at least partially within a footprint of the first set of interconnects.

In Aspect 3, the subject matter of Aspect 2 optionally includes a via located in the first interconnect region and in electrical communication with the second set of interconnects, wherein the via facilitates routing of an electrical signal associated with the second set of interconnects through the footprint of the first set of interconnects.

In Aspect 4, the subject matter of any one or more of Aspects 2-3 optionally include a third set of interconnects located proximate to a second end of the substrate, wherein second end of the substrate is opposite to the first end of the substrate.

In Aspect 5, the subject matter of any one or more of Aspects 2-4 optionally include wherein the substrate body defines a through hole extending through a thickness of the substrate body and the third set of interconnects are located between the through hole defined by the substrate body and the second end of the substrate.

In Aspect 6, the subject matter of any one or more of Aspects 2-5 optionally include a third set of interconnects included in the second interconnect region and located remote from the substrate body.

In Aspect 7, the subject matter of any one or more of Aspects 2-6 optionally include the socket.

In Aspect 8, the subject matter of any one or more of Aspects 2-7 optionally include wherein the second interconnect region is spaced apart from the first interconnect region by a keyway defined by the substrate.

In Aspect 9, the subject matter of any one or more of Aspects 2-8 optionally include wherein the keyway extends along the first set of interconnects and the second set of interconnects.

In Aspect 10, the subject matter of any one or more of Aspects 2-9 optionally include wherein the keyway is a first keyway, and further comprising a second keyway extending along the first set of interconnects and the second set of interconnects.

In Aspect 11, the subject matter of any one or more of Aspects 2-10 optionally include memory device, and the inactive region and the first set of interconnects are located between the second set of interconnects and the substrate body.

Aspect 12 is a socket configured to couple with an M.2 memory device, comprising: a socket body defining a socket recess and a socket opening, wherein the socket recess is configured to receive a portion of the M.2 memory device through the socket opening; a first interconnect region, including: a first set of interconnects located proximate to the socket opening; a second set of interconnects located remote from the socket opening and physically separated from the first set of interconnects by a first inactive region, wherein the first set of interconnects are located between the inactive region and the socket opening; and a second interconnect region including a third set of interconnects and a fourth set of interconnects, wherein the third set of interconnects and the fourth set of interconnects are physically separated by a second inactive region.

In Aspect 13, the subject matter of Aspect 12 optionally includes a key extending into the socket recess, wherein: the key is located between the first interconnect region and the second interconnect region; and the key is configured to engage with a keyway of the M.2 memory device to facilitate alignment of the M.2 memory device with respect to the socket.

In Aspect 14, the subject matter of any one or more of Aspects 12-13 optionally include memory device is received in the socket recess.

In Aspect 15, the subject matter of any one or more of Aspects 12-14 optionally include a third interconnect region located proximate to a mounting feature of the socket and located remote from the socket body.

In Aspect 16, the subject matter of any one or more of Aspects 12-15 optionally include memory device and the motherboard.

In Aspect 17, the subject matter of any one or more of Aspects 12-16 optionally include wherein the key is configured to inhibit the second set of interconnects from interfacing with an incompatible electronic device.

Aspect 18 is an electronic system, comprising: an M.2 memory device, including: a substrate having a substrate body and a first interconnect region located proximate to a first end of the substrate and extending from the substrate body, the first interconnect region including: a first set of interconnects located proximate to the substrate body; a second set of interconnects located remote from the substrate body and physically separated from the first set of interconnects by an inactive region, wherein the first set of interconnects are located between the inactive region and the substrate body; and a second interconnect region located at the first end of the substrate and extending from the substrate body; one or more memory die coupled to the substrate; and wherein the first set of interconnects and the second set of interconnects are configured to facilitate the electrical communication between a socket and the one or more memory die; a motherboard including a socket configured to couple with the M.2 memory device, wherein the socket is configured to facilitate the electrical communication of the motherboard with the M.2 memory device.

In Aspect 19, the subject matter of Aspect 18 optionally includes wherein the electrical traces in communication with the second set of interconnects are located at least partially within a footprint of the first set of interconnects.

In Aspect 20, the subject matter of Aspect 19 optionally includes a via located in the first interconnect region and in electrical communication with the second set of interconnects, wherein the via facilitates routing of an electrical signal associated with the second set of interconnects through the footprint of the first set of interconnects In Aspect 21, the subject matter of any one or more of Aspects 18-20 optionally include wherein the second interconnect region is spaced apart from the first interconnect region by a keyway defined by the substrate.

In Aspect 22, the subject matter of Aspect 21 optionally includes memory device with respect to the socket.

Each of these non-limiting aspects may stand on its own, or may be combined in various permutations or combinations with one or more of the other aspects.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The invention claimed is:

1. An electronic device, comprising:
   a substrate having a substrate body;
   a first interconnect region proximate a first end of the substrate, the first interconnect region includes:
      a first set of interconnects; and
      a second set of interconnects physically separated from the first set of interconnects by an inactive region, wherein:
         the first set of interconnects are located between the inactive region and the substrate body;
         the second set of interconnects are located between the inactive region and a perimeter edge of the first interconnect region; and
         the first set of interconnects and the second set of interconnects are configured for electrical communication between a socket and
         one or more die coupled with the substrate; and
   one or more electrical traces in communication with the second set of interconnects, wherein the one or more electrical traces are located at least partially within a footprint of the first set of interconnects.

2. The electronic device of claim 1, wherein the one or more die comprises a memory die.

3. The electronic device of claim 1, wherein the electronic device comprises an M.2 memory device.

4. The electronic device of claim 1, further comprising a second interconnect region spaced apart from the first interconnect region by a keyway defined by the substrate.

5. The electronic device of claim 4, wherein the keyway extends along the first set of interconnects and the second set of interconnects.

6. A socket configured for coupling with an electronic device, the socket comprising:
   a socket body having a socket recess and a socket opening, wherein the socket recess is configured to receive a portion of the electronic device through the socket opening;
   a first interconnect region located proximate to a first end of the socket body, the first interconnect region including:
      a first set of interconnects proximate the socket opening;
      a second set of interconnects remote from the socket opening, wherein the second set of interconnects are physically separated from the first set of interconnects by an inactive region; and
      wherein the first set of interconnects are located between the inactive region and the socket opening; and
   a second interconnect region including a third set of interconnects located proximate to a second end of the socket body opposite the first end of the socket body.

7. The socket of claim 6, further comprising:
   a key located between the first interconnect region and the second interconnect region; and
   the key is configured to engage with a corresponding keyway of the electronic device.

8. The socket of claim 7, wherein:
   the inactive region comprises a first inactive region and a second inactive region;
   the first inactive region is located between the first set of interconnects and the second set of interconnects; and
   the second inactive region is located between the third set of interconnects and a fourth set of interconnects of the second interconnect region.

9. The socket of claim 7, wherein the key is configured to inhibit the second set of interconnects from interfacing with an incompatible electronic device.

10. The socket of claim 6, wherein the electronic device comprises an M.2 memory device.

11. An electronic system, comprising:
    an electronic device including:
       a substrate having a substrate body;
       a first interconnect region proximate a first end of the substrate, the first interconnect region includes:
          a first set of interconnects; and a second set of interconnects physically separated from the first set of interconnects by an inactive region, wherein:
  the first set of interconnects are located between the inactive region and the substrate body; and
  the second set of interconnects are located between the inactive region and a perimeter edge of the first interconnect region;
one or more die coupled with the substrate; and
a second interconnect region including a third set of interconnects located proximate to a second end of the substrate, wherein the second end of the substrate is opposite to the first end of the substrate; and
a socket configured for coupling with the electronic device, wherein the first set of interconnects, the second set of interconnects, and the third set of interconnects of the electronic device are configured for electrical communication between the socket and the one or more die of the electronic device.

12. The electronic system of claim 11, further comprising a motherboard, wherein the socket is coupled with the motherboard and the socket is configured to route one or more electrical signals between the motherboard and the electronic device.

13. The electronic system of claim 11, wherein the socket includes:
a socket body having a socket recess and a socket opening, wherein the socket recess is configured to receive a portion of the electronic device through the socket opening;
a second interconnect region including:
  a third set of interconnects proximate the socket opening;
  a fourth set of interconnects remote from the socket opening, wherein the fourth set of interconnects are physically separated from the first set of interconnects by a socket inactive region; and
  wherein the third set of interconnects are located between the socket inactive region and the socket opening; and wherein the third set of interconnects are configured for coupling with the first set of interconnects and the fourth set of interconnects are configured for coupling with the second set of interconnects.

14. An electronic system, comprising:
an electronic device including:
  a substrate having a substrate body;
  a first interconnect region proximate a first end of the substrate, the first interconnect region includes:
    a first set of interconnects;
    a second set of interconnects physically separated from the first set of interconnects by an inactive region, wherein:
      the first set of interconnects are located between the inactive region and the substrate body; and
      the second set of interconnects are located between the inactive region and a perimeter edge of the first interconnect region;
  one or more die coupled with the substrate; and
  one or more electrical traces in communication with the second set of interconnects, wherein the one or more electrical traces are located at least partially within a footprint of the first set of interconnects; and
a socket configured for coupling with the electronic device, wherein the first set of interconnects, second set of interconnects, and third set of interconnects of the electronic device are configured for electrical communication between the socket and the one or more die of the electronic device.

15. The electronic system of claim 11, wherein:
the socket includes a key;
the electronic device has a keyway configured to receive the key; and
the keyway extends along the first set of interconnects and the second set of interconnects.

16. The electronic system of claim 11, wherein the electronic device comprises an M.2 memory device.

17. The electronic system of claim 15, wherein the key is configured to inhibit the second set of interconnects from interfacing with an incompatible electronic device.

* * * * *